「US011067609B2」

United States Patent
Peng et al.

(10) Patent No.: US 11,067,609 B2
(45) Date of Patent: Jul. 20, 2021

(54) METHOD OF MEASURING OUTPUT CURRENT THROUGH RESISTANCE COMPENSATION AND CONVERSION CIRCUIT THEREOF

(71) Applicant: Chicony Power Technology Co., Ltd., New Taipei (TW)

(72) Inventors: Tso-Jen Peng, New Taipei (TW); Ssu-Hao Wang, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 51 days.

(21) Appl. No.: 16/751,884

(22) Filed: Jan. 24, 2020

(65) Prior Publication Data
US 2020/0249259 A1    Aug. 6, 2020

Related U.S. Application Data

(60) Provisional application No. 62/800,048, filed on Feb. 1, 2019.

(30) Foreign Application Priority Data

Nov. 8, 2019  (TW) .................................. 108140595

(51) Int. Cl.
*G01R 19/10*  (2006.01)
*G01R 27/16*  (2006.01)
(Continued)

(52) U.S. Cl.
CPC ............. *G01R 19/10* (2013.01); *G01R 27/16* (2013.01); *G01R 19/0092* (2013.01); *H02M 1/0009* (2021.05)

(58) Field of Classification Search
CPC ................ G01R 19/00; G01R 19/0084; G01R 19/0092; G01R 19/10; G01R 27/00;
(Continued)

(56) References Cited

U.S. PATENT DOCUMENTS

| 5,276,376 A | 1/1994 | Puskas |
| 5,382,893 A | 1/1995 | Dehnel |

(Continued)

FOREIGN PATENT DOCUMENTS

| CN | 1917322 A | 2/2007 |
| CN | 101652927 A | 2/2010 |

(Continued)

OTHER PUBLICATIONS

Office Action dated Aug. 28, 2020 of the corresponding Taiwan patent application No. 108140595.

*Primary Examiner* — Hoai-An D. Nguyen
(74) *Attorney, Agent, or Firm* — Muncy, Geissler, Olds & Lowe, P.C.

(57) ABSTRACT

A method of resistance compensation for measuring output current includes the following steps: (a) providing a secondary side loop of a conversion unit, and the secondary side loop includes a sense resistor and the first line. (b) providing a control unit for controlling the conversion unit, and the control unit is coupled to the first line and the sense resistor. (c) utilizing a first current to flow through the secondary side loop to obtain a first equivalent line resistance of the first line. (d) providing a second current by the control unit flowing through a loop of the sense resistor, the first line and the control unit to obtain a second equivalent line resistance of the second line. (e) compensating the sense resistor by the control unit according to the first equivalent line resistance and the second equivalent line resistance.

14 Claims, 3 Drawing Sheets

(51) Int. Cl.
*G01R 19/00* (2006.01)
*H02M 1/00* (2006.01)

(58) Field of Classification Search
CPC ......... G01R 27/02; G01R 27/16; H02M 1/00; H02M 1/0003; H02M 1/0009
USPC ....... 324/600, 649, 691, 713, 720, 500, 512, 324/522; 702/1, 57, 64
See application file for complete search history.

(56) References Cited

U.S. PATENT DOCUMENTS

| | | | |
|---|---|---|---|
| 5,587,894 A | | 12/1996 | Naruo |
| 5,841,321 A | * | 11/1998 | Miyake ................. H03F 3/3001 330/255 |
| 6,879,502 B2 | | 4/2005 | Yoshida |
| 9,645,597 B1 | * | 5/2017 | Xiong ....................... G05F 1/70 |
| 9,899,825 B2 | | 2/2018 | Mattos et al. |
| 10,429,876 B2 | * | 10/2019 | Jo ............................. G05F 3/10 |
| 2006/0238138 A1 | | 10/2006 | Quazi |
| 2006/0284575 A1 | * | 12/2006 | Shen .................. H05B 41/2822 315/312 |
| 2011/0037445 A1 | * | 2/2011 | Ting ..................... H02M 3/156 323/234 |
| 2013/0088252 A1 | | 4/2013 | Brabetz et al. |

FOREIGN PATENT DOCUMENTS

| | | |
|---|---|---|
| CN | 107765073 A | 3/2018 |
| CN | 107765073 A | 3/2018 |
| TW | I358182 B | 2/2012 |
| TW | 201729503 A | 8/2017 |

\* cited by examiner

METHOD OF MEASURING OUTPUT CURRENT THROUGH RESISTANCE COMPENSATION AND CONVERSION CIRCUIT THEREOF

BACKGROUND

Technical Field

The present disclosure relates to a method of measuring output current through resistance compensation and conversion circuit thereof, and more particularly to a method of measuring output current through resistance compensation and conversion circuit thereof for reducing difficulty of wire layout.

Description of Related Art

The statements in this section merely provide background information related to the present disclosure and do not necessarily constitute prior art.

Nowadays, in the situation that power delivery (PD) technology is becoming more and more popular, and more and more adapters have a power delivery function. Generally, when the adapter performs output current detection, a current detection resistor is added to the secondary side of the internal conversion circuit to detect the output current to achieve the purpose of monitoring the output current. In this application, in order to obtain accurate output current detection side, the connection position of the wire layout becomes very important. Further, in order to avoid affecting the accuracy of current detection from the impedance of the actual wire, a special layout must be used on the wire layout.

Specifically, the two ends of the current detection resistor must be directly connected to the two current detection pins of the controller, and cannot be coupled to the current detection pins of the controller from any ground point. The reason is that if any ground point is coupled to the controller, the wire from the current detection resistor to the ground point will generate additional wire impedance. Since the output current flowing through this wire impedance will also cause a voltage drop, which will cause a misjudgment of the current detection of the controller and incorrectly control the conversion circuit. However, under actual conditions, if the circuit layout is not noticed or unfamiliar, it is easy to mistakenly connect one of current detection pins of the controller to other ground pins without directly connecting to the current detection resistor, which will cause a misjudgment on the current detection.

In addition, since the design of controller pins becomes more and more precise, its single pin becomes more and more multifunctional. Therefore, in addition to the current detection function, one of the current detection pins of the current controller also adds the controller ground function. At this condition, the current detection pin with a ground function must be directly connected to the ground terminal of the output capacitor of the conversion circuit to accurately detect the voltage at the ground point. Therefore, the ground end of the output capacitor needs to be directly coupled to one end of the current detection resistor so that in the case that the controller can obtain accurate output current and accurate ground voltage, the difficulty of wire layout is greatly increased.

Therefore, how to design a method of measuring output current through resistance compensation and a conversion circuit thereof, using a simple resistance compensation method to reduce the difficulty of wire layout in the case that the controller can obtain accurate output current and accurate ground voltage is an important issue for the inventors of the present disclosure.

SUMMARY

In order to solve the above-mentioned problems, the present disclosure provides a method of measuring output current through resistance compensation. The method of measuring output current through resistance compensation includes the following steps of: providing a secondary-side loop of a conversion unit, the secondary-side loop comprising a detection resistor and a first wire, and the first wire formed from a first end of the detection resistor to a ground point, providing a control unit of the conversion unit, the control unit coupled to the ground point and a second end of the detection resistor, obtaining a first equivalent wire resistance of the first wire according to a first current flowing through the secondary-side loop, obtaining a second equivalent wire resistance from the ground point to a second wire of the control unit according to a second current provided by the control unit flowing through the detection resistor, the ground point, and the control unit, and compensating the detection resistor by the control unit according to the first equivalent wire resistance and the second equivalent wire resistance.

In one embodiment, the first current flows through the detection resistor and the first wire to generate a first voltage, and a first wire voltage of the first wire is obtained by subtracting a detection voltage of the detection resistor from the first voltage.

In one embodiment, the control unit obtains the first equivalent wire resistance according to the first current and the first wire voltage.

In one embodiment, the second current flows through the detection resistor, the first wire, and the second wire to generate a second voltage, and a second wire voltage of the second wire is obtained by subtracting the detection voltage and the first wire voltage from the second voltage.

In one embodiment, the control unit obtains the second equivalent wire resistance according to the second current and the second wire voltage.

In one embodiment, the first current is provided by a load coupled to the secondary-side loop.

In one embodiment, the second end is coupled to the control unit by a shortest coupling distance.

In one embodiment, a resistance of the control unit is greater than the detection resistor and the first equivalent wire resistance.

In one embodiment, the control unit obtains the first equivalent wire resistance and the second equivalent wire resistance before the conversion unit operates, and obtain a magnitude of the output current according to a voltage signal of the detection resistor when the conversion unit operates.

In one embodiment, the control unit complete measurement of the ground and the output current of the control unit through a first contact coupled to the first end and a second contact coupled to the ground point by the control unit.

In order to solve the above-mentioned problems, the present disclosure provides a conversion circuit of measuring output current through resistance compensation. The conversion circuit of measuring output current through resistance compensation includes a conversion unit and a control unit. The conversion unit includes a secondary-side loop, and the secondary-side loop includes a detection resistor and a first wire. The detection resistor is coupled to the secondary-side loop in series. The first wire is formed from a first end of the detection resistor to a ground point.

The control unit is coupled to the ground point and a second end of the detection resistor. The control unit obtains a first equivalent wire resistance of the first wire according to a first current flowing through the secondary-side loop, and obtains a second equivalent wire resistance from the ground point to a second wire of the control unit according to a second current provided by the control unit flowing through the detection resistor, the ground point, and the control unit. The control unit compensates the detection resistor according to the first equivalent wire resistance and the second equivalent wire resistance.

In one embodiment, the second end is coupled to the control unit by a shortest coupling distance.

In one embodiment, a resistance of the control unit is greater than the detection resistor and the first equivalent wire resistance.

In one embodiment, the control unit includes a first contact and a second contact. The first contact is coupled to the ground point. The second contact is coupled to the second end. The control unit completes measure of the ground and the output current of the control unit through the first contact and the second contact.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWING

The present disclosure can be more fully understood by reading the following detailed description of the embodiment, with reference made to the accompanying drawings as follows.

DETAILED DESCRIPTION

Figure 1:
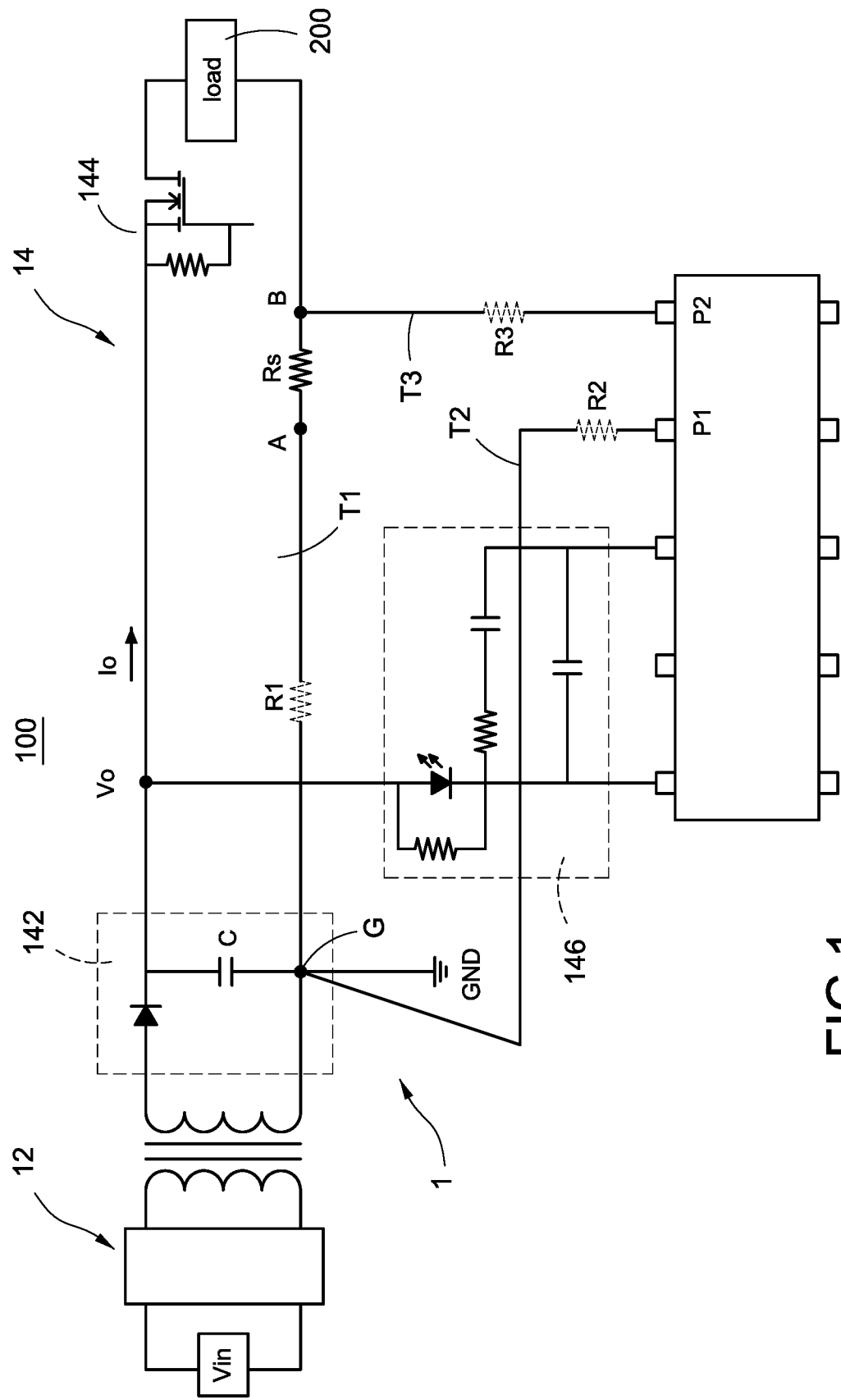
FIG. 1 is a block circuit diagram of a conversion circuit of measuring an output current through resistance compensation according to the present disclosure.

Reference will now be made to the drawing figures to describe the present disclosure in detail. It will be understood that the drawing figures and exemplified embodiments of present disclosure are not limited to the details thereof.

Please refer to FIG. 1, which shows a block circuit diagram of a conversion circuit of measuring an output current through resistance compensation according to the present disclosure. The conversion circuit 100 includes a conversion unit 1 and a control unit 2. When the conversion circuit 100 operates, the control unit 2 controls the conversion unit 1 to convert an input power source Vin into an output power source Vo to provide the required power to a load 200. The conversion unit 1 includes a primary-side loop 12 and a secondary-side loop 14, and the control unit 2 controls the primary-side loop 12 and the secondary-side loop 14 to convert the input power source Vin into the output power source Vo. The secondary-side loop 14 includes a filter circuit 142, an isolated switch 144, a feedback compensation circuit 146, and a detection resistor Rs. The filter circuit 142, the isolated switch 144, the load 200, and the detection resistor Rs are formed a closed loop by a series-connected manner. If the conversion circuit 100 is abnormal, the control unit 2 turns off the isolated switch 144 so that the conversion circuit 100 is no longer provided with the output power source Vo to the load 200 to provide a circuit protection.

A ground end of an output capacitor C is set to a ground point G, and the ground point G is a total ground position of the secondary-side loop 14 and the control unit 2. The feedback compensation circuit 146 is coupled to a path of the filter circuit 142 to the load 200, and the output power source Vo is detected and provided to the control unit 2 for feedback compensation so that the control unit 2 can stably control the output power source Vo. A wire extending from a first end A of the detection resistor Rs to the ground point G is defined as a first wire T1, and a wire resistance of the first wire T1 is a first equivalent wire resistance R1. The control unit 2 includes a first contact P1 and a second contact P2. The first contact P1 is coupled to the ground point G, and the second contact P2 is coupled to a second end B of the detection resistor Rs. A wire extending from the first contact P1 to the ground point G is defined as a second wire T2, and a wire resistance of the second wire T2 is a second equivalent wire resistance R2. A wire extending from the second end B of the detection resistor Rs to the second contact P2 is defined as a third wire T3, and a wire resistance of the third wire T3 is a third equivalent wire resistance R3.

Specifically, since the first wire T1, the second wire T2, and the third wire T3 all have equivalent wire resistances R1-R3, the equivalent wire resistances R1-R3 cause a voltage signal measured through the detection resistor Rs by the control unit 2 is not accurate enough. The reason is that when an output current Io flows through the equivalent wire resistances R1-R3, wire voltage drops also occur. That is, a voltage value of the voltage signal is equal to the sum of a voltage across the equivalent wire resistance R1-R3 and a voltage across the detection resistor Rs, and not just the voltage across the detection resistor Rs. Therefore, the voltage signal measured by the control unit 2 is not actually equal to the magnitude of the output current Io. In addition, in terms of circuit layout, if the first end A and the second end B of the detection resistor Rs are respectively coupled to the first contact P1 and the second contact P2 of the control unit 2 at equal distances, the problem of inaccurate measurement of the output current Io can be solved. However, the ground end of the output capacitor C must be directly coupled to the first end A of the detection resistor Rs. In order to make the level of the ground point accurately zero, the above three points (the ground end of the output capacitor C, the first end A of the detection resistor Rs, and the first contact P1 of the control unit 2) must be as close as possible. As a result, it is difficult for the circuit layout to consider the above reasons.

Therefore, the main purpose of the present disclosure is that the ground end of the output capacitor C needs no be as close as possible to the first end A of the detection resistor Rs through the resistance compensation. Also, the first end A and the second end B of the detection resistor Rs need not be coupled to the first contact P1 and the second contact P2 of the control unit 2 respectively at equal distances. Therefore, the conversion circuit 100 of the present disclosure can achieve the effect of easy circuit layout through the circuit design described above. In addition, since the control unit 2 has performed resistance compensation before the conversion circuit 100 actually operates, the output current Io can be accurately measured when the conversion circuit 100 actually operates. Therefore, due to the above features, the conversion circuit 100 of the present disclosure can achieve the effect of increasing the measurement accuracy of the output current Io. In one embodiment of the present disclosure, the detailed structure and compensation calculation method of the conversion circuit 100 will be described later.

Figure 2:
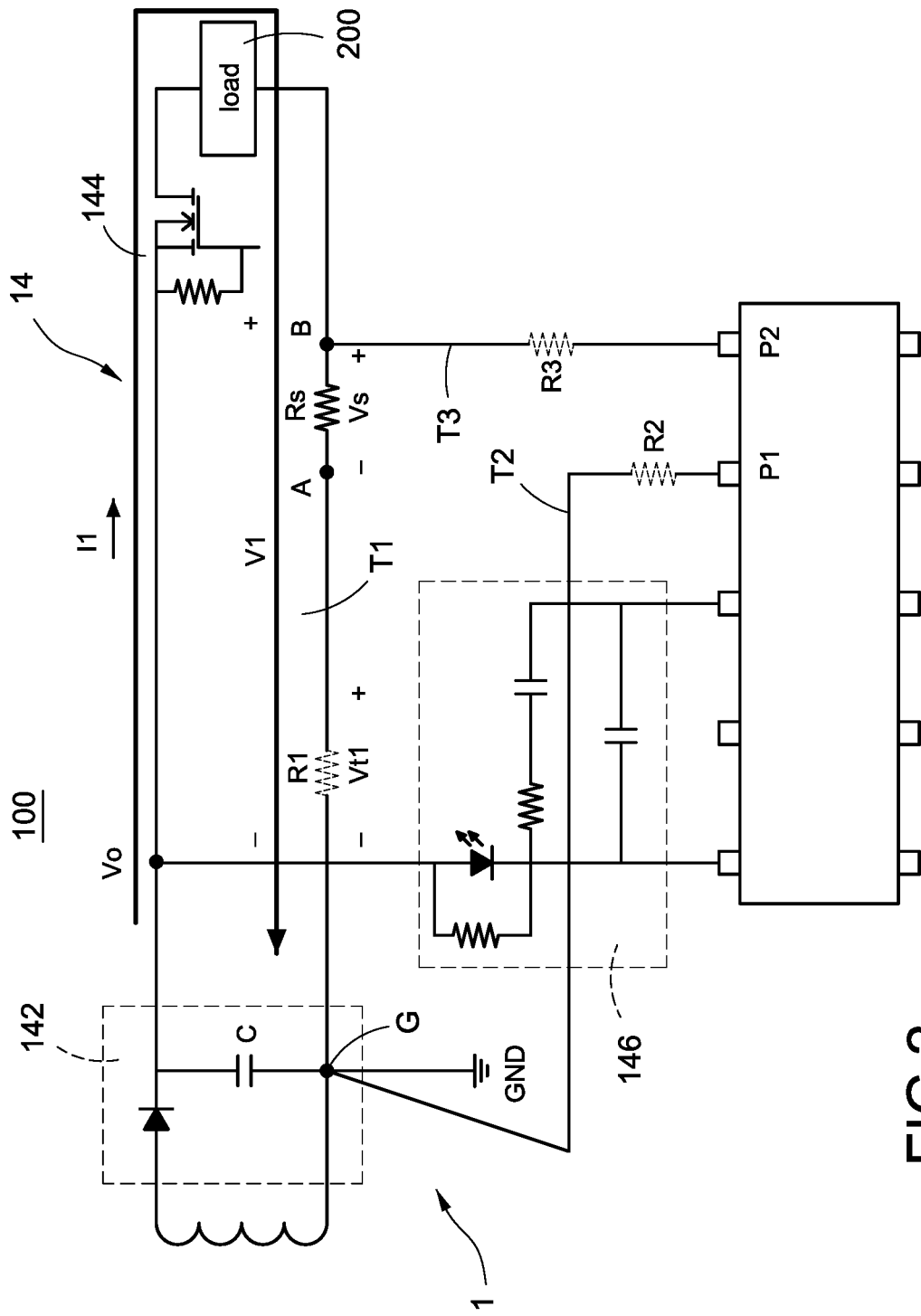
FIG. 2 is a block circuit diagram of a first step of calculating the resistance compensation according to the present disclosure.

Please refer to FIG. 2, which shows a block circuit diagram of a first step of calculating the resistance compensation according to the present disclosure, and also refer to FIG. 1. First, in a first step, before the conversion circuit 100 operates, a first current I1 flows through the secondary-side loop 14 to obtain a resistance of the first equivalent wire resistance R1. The first current I1 can be provided by an external electronic device, and the easiest way is to use an electronic load coupled to the conversion circuit 100. That is, the load 200 is the electronic load, and the load 200 can extract a specific current according to operator's setting. When the first current flows through the secondary-side loop 14, the first current I1 flows through the detection resistor Rs and the first wire T1. At this condition, the control unit 2 obtains a first voltage V1 formed from the second end B of the detection resistor Rs to the ground point G. Afterward, the control unit 2 obtains a first wire voltage Vt1 of the first wire T1 by subtracting a detection voltage Vs of the detection resistor Rs from the first voltage V1. Since the impedance of the first contact P1 and the impedance of the second contact P2 of the control unit 2 are high impedances (usually the impedance is kiloohm level), the impedance of the first contact P1 and the impedance of the second contact P2 are much greater than the impedance of the detection resistor Rs and the impedance of the first equivalent wire resistance R1 (usually the impedance is ohm level). Therefore, when the first current I1 flows through the secondary-side loop 14, the first current I1 fails to flow to the control unit 2 through the second wire T2 and the third wire T3, that is, the current flowing to the first contact P1 and the current flowing to the second contact P2 approach zero.

Since the resistance of the detection resistor Rs is known when the circuit is designed, the control unit 2 obtains the resistance of the detection resistor Rs before performing the first step of the resistance compensation calculation. Since the first current I1 can draw a specific current according to the operator's setting, the control unit 2 has also obtained the current value of the first current I1. The control unit 2 can obtain the detection voltage Vs once the resistance of the detection resistor Rs and the first current I1 are known. Afterward, the control unit 2 can obtain the first wire voltage Vt1 of the first wire T1 by subtracting the detection voltage Vs from the first voltage V1. Finally, the control unit 2 can obtain the first equivalent wire resistance R1 according to the known first wire voltage Vt1 and first current I1. In summary, the relationship of the first step of the resistance compensation calculation can be represented by: V1=Vs+Vt1=I1*(Rs+R1), and the control unit 2 can obtain the first equivalent wire resistance R1 by flowing through the first current I2 through the secondary-side loop 14.

Figure 3:
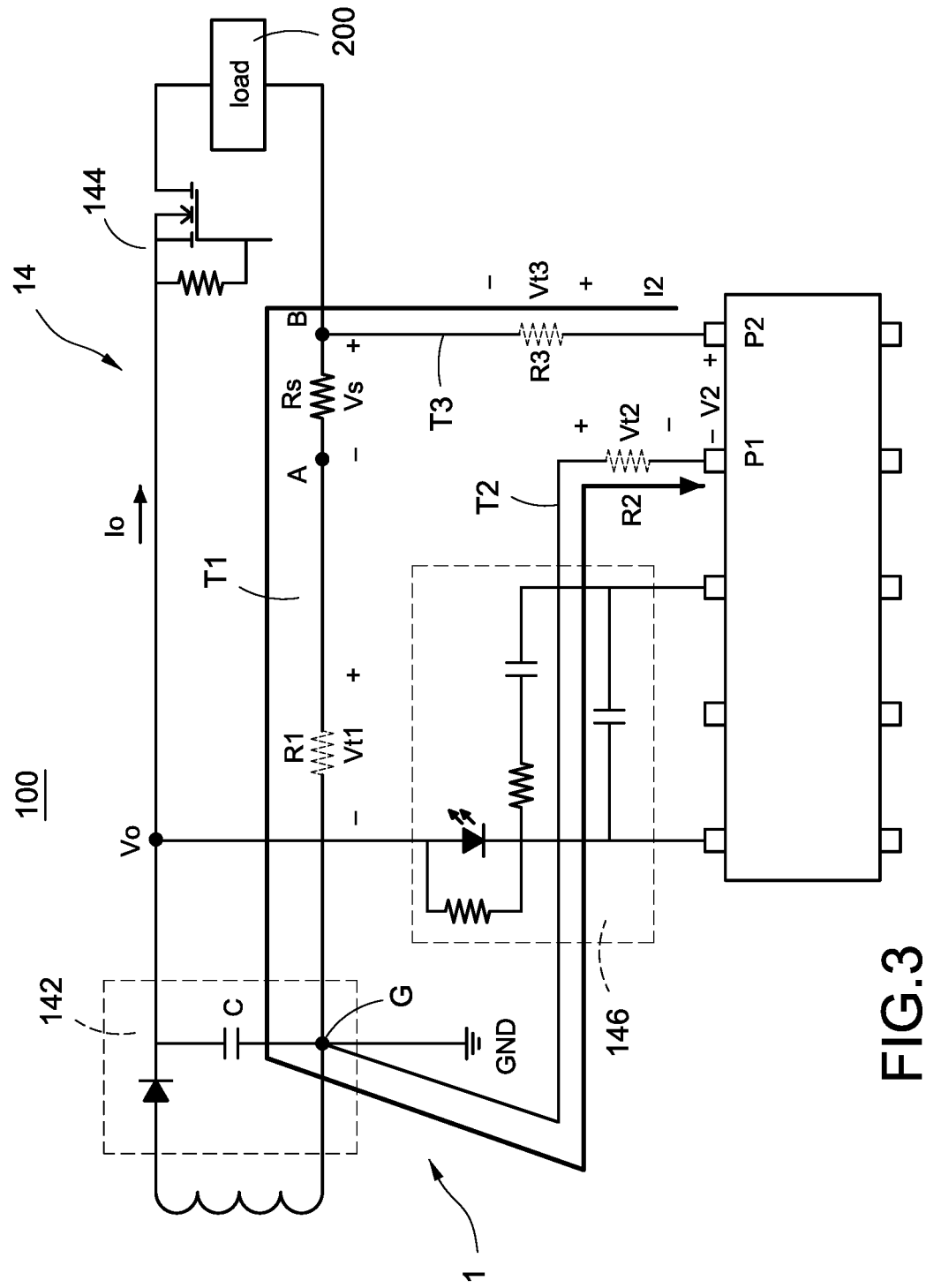
FIG. 3 is a block circuit diagram of a second step of calculating the resistance compensation according to the present disclosure.

Please refer to FIG. 3, which shows a block circuit diagram of a second step of calculating the resistance compensation according to the present disclosure, and also refer to FIG. 1 and FIG. 2. First, in a second step, after the control unit 2 obtains the first equivalent wire resistance R1, the control unit 2 provides a second current I2 which flows through a path composed of the second contact P2, the detection resistor Rs, the ground point G, and the first contact P1, or through a path composed of the first contact P1, the ground point G, the detection resistor Rs, and the second contact P2, thereby obtaining the second equivalent wire resistance R2 of the second wire T2. Since the path further includes the third equivalent wire resistance R3 of the third wire T3 from the second end B of the detection resistor Rs to the second contact P2 of the control unit 2, the path includes two unknown parameters: the second equivalent wire resistance R2 and the third equivalent wire resistance R3. In the case that this loop includes two unknown parameters, if there is no special calculation method, only the total resistance of the second equivalent wire resistance R2 and the third equivalent wire resistance R3 can be obtained. Although the control unit 2 can also use the total resistance for resistance compensation, the second equivalent wire resistance R2 and the third equivalent wire resistance R3 cannot be accurately known separately. Therefore, the accuracy of the output current Io obtained by the resistance compensation for the total resistance value is slightly lower than that obtained by the respective resistances.

In order to obtain high accuracy, the coupling distance between the second end B of the detection resistor Rs and the second contact P2 of the control unit 2 must be as close as possible so as to shorten the third wire T3 as much as possible. When the second end B of the detection resistor Rs is coupled to the second contact P2 of the control unit 2 with the shortest coupling distance, the wire length of the third wire T3 approaches zero so that the third equivalent wire resistance R3 also approaches zero. Therefore, it can make this loop only one unknown parameter of the second equivalent wire resistance R2. In terms of circuit layout, since conversion circuit 100 of the present disclosure only needs to connect the coupling distance of the second end B of the detection resistor Rs to the second contact P2 of the control unit as close as possible, and the layout of other ground wires is not necessary to use this special coupling manner. Therefore, the effect of easy circuit layout and easy design can be achieved.

When the second current I2 flows through the path composed of the control unit 2, the detection resistor Rs, and the ground point G, the second current I2 would flow through the detection resistor Rs, the first wire T1, the second wire T2, and the third wire T3. At this condition, the control unit 2 obtains a second voltage V2 formed from the first contact P1 to the second contact P2, that is, the second voltage V2 is equal to the sum of a voltage across the detection resistor Rs, a voltage across the first wire T1, a voltage across the second wire T2, and a voltage across the third wire T3. Afterward, the sum of the voltage across the second wire T2 (i.e., a second wire voltage Vt2) and the voltage across the third wire T3 (i.e., a third wire voltage Vt3) is equal to the detection voltage Vs and the first wire voltage Vt1 subtracted from the second voltage V2, that is, V2−Vs−Vt1=Vt2+Vt3. Since the third equivalent wire resistance R3 approaches zero, the third wire voltage Vt3 approaches zero. Therefore, the second wire voltage Vt2 of the second wire T2 can be obtained.

Since the resistance of the detection resistor Rs and the first equivalent wire resistance R1 are known, the control unit 2 obtains the resistance values of the detection resistor Rs and the first equivalent wire resistance R1 before the second step of calculating the resistance compensation. In addition, since the second current I2 is provided by the control unit 2, the control unit 2 also obtains a current value of the second current I2. When the resistance of the detection resistor Rs, the first equivalent wire resistance R1, and the current value of the second current I2 are known, the control unit 2 can obtain the detection voltage Vs and the and the first wire voltage Vt1. Afterward, the control unit 2 can obtain the second voltage V2 of the second wire T2 by subtracting the detection voltage Vs and the first wire voltage Vt1 from the second voltage V2 since the third wire voltage Vt3 approaches zero. Finally, the control unit 2 can obtain the resistance of the second equivalent wire resistance R2 according to the known second wire voltage Vt2 and second current I2. In summary, the relationship of the second step of calculating the resistance compensation can be represented by: V2=Vs+Vt1+Vt2+Vt3=I2*(R1+R2+R3+Rs), and the control unit 2 can obtain the second equivalent wire resistance R2 by the second current I2 flowing through the loop from the second contact P2 to the first contact P1.

Please refer to FIG. 2 and FIG. 3, before the conversion unit 1 actually operates, the control unit 2 has obtained the first equivalent wire resistance R1 and the second equivalent wire resistance R2. After the first equivalent wire resistance R1 and the second equivalent wire resistance R2 have obtained by the control unit 2, the control unit 2 compensates the detection resistor Rs according to the first equivalent wire resistance R1 and the second equivalent wire resistance R2 so that the resistance compensation has completed before the conversion unit 1 actually operates. Therefore, when the conversion circuit 100 actually operates, the control unit 2 can accurately know the output current Io of the conversion unit 1 through the voltage signal measured by the detection resistor Rs. That is, the voltage signal measured by the control unit 2 is actually a voltage drop generated by the detection resistor Rs, the first equivalent wire resistance R1, and the second equivalent wire resistance R2, and then the output current Io can be accurately calculated by converting the voltage drop to the corresponding current using the resistance.

In one embodiment, the control unit 2 is applicable to a controller that uses only the first contact P1 and the second contact P2 to complete the measurement of the ground and the output current Io of the control unit 2. Specifically, since the design of the controller becomes more and more precise, its single pin becomes more and more multifunctional. In the conventional controller, the measurement of the ground and the output current Io of the control unit 2 are usually separated so three pins are required to complete the measurement of the ground and the output current Io of the control unit 2. When the control unit 2 integrates the measurement pins of ground and output current Io into two, and its good wire layout design is more difficult. The resistance compensation of the present disclosure is used to reduce the difficulty of wire layout and increase the accuracy of detecting the output current Io.

In summary, the main advantages and effects of the embodiments of the present disclosure are that through the resistance compensation of the present disclosure, the conversion circuit can make the ground end of the output capacitor on the secondary-side circuit no need to be as close as possible to the detection resistor, and the two ends of the detection resistor do not need to be separately coupled to the control unit at equal distances so as to achieve the effects of accurately measuring the output current and reducing the difficulty of circuit layout.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A method of measuring output current through resistance compensation, comprising following steps of:
providing a secondary-side loop of a conversion unit, the secondary-side loop comprising a detection resistor and a first wire, and the first wire formed from a first end of the detection resistor to a ground point,
providing a control unit of the conversion unit, the control unit coupled to the ground point and a second end of the detection resistor,
obtaining a first equivalent wire resistance of the first wire according to a first current flowing through the secondary-side loop,
obtaining a second equivalent wire resistance from the ground point to a second wire of the control unit according to a second current provided by the control unit flowing through the detection resistor, the ground point, and the control unit, and
compensating the detection resistor by the control unit according to the first equivalent wire resistance and the second equivalent wire resistance.

2. The method of measuring output current through resistance compensation in claim 1, wherein the first current flows through the detection resistor and the first wire to generate a first voltage, and a first wire voltage of the first wire is obtained by subtracting a detection voltage of the detection resistor from the first voltage.

3. The method of measuring output current through resistance compensation in claim 2, wherein the control unit is configured to obtain the first equivalent wire resistance according to the first current and the first wire voltage.

4. The method of measuring output current through resistance compensation in claim 2, wherein the second current flows through the detection resistor, the first wire, and the second wire to generate a second voltage, and a second wire voltage of the second wire is obtained by subtracting the detection voltage and the first wire voltage from the second voltage.

5. The method of measuring output current through resistance compensation in claim 4, wherein the control unit is configured to obtain the second equivalent wire resistance according to the second current and the second wire voltage.

6. The method of measuring output current through resistance compensation in claim 1, wherein the first current is provided by a load coupled to the secondary-side loop.

7. The method of measuring output current through resistance compensation in claim 1, wherein the second end is coupled to the control unit by a shortest coupling distance.

8. The method of measuring output current through resistance compensation in claim 7, wherein a resistance of the control unit is greater than the detection resistor and the first equivalent wire resistance.

9. The method of measuring output current through resistance compensation in claim 1, wherein the control unit is configured to obtain the first equivalent wire resistance and the second equivalent wire resistance before the conversion unit operates, and obtain a magnitude of the output current according to a voltage signal of the detection resistor when the conversion unit operates.

10. The method of measuring output current through resistance compensation in claim 1, wherein the control unit is configured to complete measurement of the ground and the output current of the control unit through a first contact coupled to the first end and a second contact coupled to the ground point by the control unit.

11. A conversion circuit of measuring output current through resistance compensation, comprising:
- a conversion unit comprising a secondary-side loop, and the secondary-side loop comprising:
- a detection resistor coupled to the secondary-side loop in series, and
- a first wire formed from a first end of the detection resistor to a ground point, and
- a control unit coupled to the ground point and a second end of the detection resistor,
- wherein the control unit is configured to obtain a first equivalent wire resistance of the first wire according to a first current flowing through the secondary-side loop, and obtain a second equivalent wire resistance from the ground point to a second wire of the control unit according to a second current provided by the control unit flowing through the detection resistor, the ground point, and the control unit; the control unit is configured to compensate the detection resistor according to the first equivalent wire resistance and the second equivalent wire resistance.

12. The conversion circuit of measuring output current through resistance compensation in claim 11, wherein the second end is coupled to the control unit by a shortest coupling distance.

13. The conversion circuit of measuring output current through resistance compensation in claim 12, wherein a resistance of the control unit is greater than the detection resistor and the first equivalent wire resistance.

14. The conversion circuit of measuring output current through resistance compensation in claim 11, wherein the control unit comprises:
- a first contact coupled to the ground point, and
- a second contact coupled to the second end,
- wherein the control unit is configured to complete measure of the ground and the output current of the control unit through the first contact and the second contact.

* * * * *